US012204970B1

(12) United States Patent
Peach et al.

(10) Patent No.: US 12,204,970 B1
(45) Date of Patent: Jan. 21, 2025

(54) RFID TAG RECTIFIERS WITH BIAS CURRENT REUSE

(71) Applicant: Impinj, Inc., Seattle, WA (US)

(72) Inventors: Charles J. T. Peach, Seattle, WA (US); John D. Hyde, Corvallis, OR (US); Jay A. Kuhn, Seattle, WA (US); Theron Stanford, Seattle, WA (US); Amita Patil, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 29 days.

(21) Appl. No.: 17/970,794

(22) Filed: Oct. 21, 2022

Related U.S. Application Data

(63) Continuation of application No. 16/925,576, filed on Jul. 10, 2020, now Pat. No. 11,481,591, which is a continuation of application No. 15/985,291, filed on May 21, 2018, now Pat. No. 10,713,549.

(60) Provisional application No. 62/509,777, filed on May 23, 2017.

(51) Int. Cl.
*G06K 19/07* (2006.01)
*H03K 17/687* (2006.01)

(52) U.S. Cl.
CPC ..... *G06K 19/0715* (2013.01); *H03K 17/6872* (2013.01); *G06K 19/0701* (2013.01); *G06K 19/0707* (2013.01); *G06K 19/0709* (2013.01); *G06K 19/0713* (2013.01); *G06K 19/0723* (2013.01)

(58) Field of Classification Search
CPC .................................................. G06K 19/0723
See application file for complete search history.

(56) References Cited

U.S. PATENT DOCUMENTS

| | | |
|---|---|---|
| 5,889,428 A | 3/1999 | Young |
| 6,037,622 A | 3/2000 | Lin et al. |
| 6,075,402 A | 6/2000 | Ghilardelli et al. |
| 6,359,501 B2 | 3/2002 | Lin et al. |
| 7,561,866 B2 | 7/2009 | Oliver et al. |
| 7,768,406 B1 | 8/2010 | Peach et al. |
| 7,907,899 B1 | 3/2011 | Oliver |
| 7,944,279 B1 | 5/2011 | El |
| 8,045,947 B2 | 10/2011 | Mandal et al. |
| 8,244,201 B2 | 8/2012 | Oliver et al. |
| 8,362,825 B2 | 1/2013 | Bergler et al. |
| 8,428,515 B1 | 4/2013 | Oliver |
| 8,687,395 B2 | 4/2014 | El |
| 9,000,835 B1 | 4/2015 | Peach et al. |
| 9,184,671 B2 | 11/2015 | Yoshida |
| 9,768,711 B2 | 9/2017 | Hameed et al. |

(Continued)

OTHER PUBLICATIONS

Lin, et al. "Novel high positive and negative pumping circuits for low supply voltage", 1999 IEEE International Symposium on Circuits and Systems (ISCAS), May 30-Jun. 2, 1999, pp. 4.

(Continued)

*Primary Examiner* — Christopher Stanford
(74) *Attorney, Agent, or Firm* — Turk IP Law, LLC

(57) ABSTRACT

Embodiments are directed to rectifiers using a single bias current or bias current path to bias multiple rectifying elements. A rectifier that has multiple rectifier stages coupled together serially includes a bias current path coupled to each of the rectifier stages. Thee bias current path is configured to simultaneously bias rectifying elements in each of the rectifier stages by using a bias current to bias a first rectifying element and reusing the bias current to bias other rectifying elements.

20 Claims, 8 Drawing Sheets

(56) References Cited

U.S. PATENT DOCUMENTS

| | | |
|---|---|---|
| 9,886,658 B1 | 2/2018 | Stanford et al. |
| 10,312,743 B2 | 6/2019 | Ouda et al. |
| 10,713,549 B1 | 7/2020 | Peach et al. |
| 2004/0008013 A1 | 1/2004 | Gay |
| 2006/0128345 A1 | 6/2006 | Ootaka et al. |
| 2008/0080214 A1 | 4/2008 | Umeda et al. |
| 2013/0299593 A1 | 11/2013 | Glidden, III |

OTHER PUBLICATIONS

Papatto, et al, "A 90-nm CMOS Threshold-Compensated RF Energy Harvester", IEEE Journal of Solid-State Circuits, vol. 46, Issue: 9, Sep. 2011, pp. 13.

Zoscher, et al, "A Differential Threshold Voltage Compensated RF-DC Power Converter for RFID Tag ICs", IEEE, 2017 Integrated Nonlinear Microwave and Millimetre-wave Circuits Workshop (INM-MiC), Apr. 20-21, 2017, pp. 3.

SIGNAL PATH DURING R→T

SIGNAL PATH DURING T→R

RFID TAG RECTIFIERS WITH BIAS CURRENT REUSE

CROSS REFERENCE TO RELATED APPLICATIONS

This application is a continuation of U.S. patent application Ser. No. 16/925,576 filed on Jul. 10, 2020, which is a continuation of U.S. patent application Ser. No. 15/985,291 filed on May 21, 2018, which in turn claims the benefit of U.S. Provisional Patent Application Ser. No. 62/509,777 filed on May 23, 2017. The disclosures of the above application are hereby incorporated by reference for all purposes.

BACKGROUND

Radio-Frequency Identification (RFID) systems typically include RFID readers, also known as RFID reader/writers or RFID interrogators, and RFID tags. RFID systems can be used in many ways for locating and identifying objects to which the tags are attached. RFID systems are useful in product-related and service-related industries for tracking objects being processed, inventoried, or handled. In such cases, an RFID tag is usually attached to an individual item, or to its package.

In principle, RFID techniques entail using an RFID reader to inventory one or more RFID tags, where inventorying involves at least singulating a tag and receiving an identifier from the singulated tag. "Singulated" is defined as a reader singling-out one tag, potentially from among multiple tags, for a reader-tag dialog. "Identifier" is defined as a number identifying the tag or the item to which the tag is attached, such as a tag identifier (TID), electronic product code (EPC), etc. The reader transmitting a Radio-Frequency (RF) wave performs the interrogation. The RF wave is typically electromagnetic, at least in the far field. The RF wave can also be predominantly electric or magnetic in the near or transitional near field. The RF wave may encode one or more commands that instruct the tags to perform one or more actions.

In typical RFID systems, an RFID reader transmits a modulated RF inventory signal (a command), receives a tag reply, and transmits an RF acknowledgement signal responsive to the tag reply. A tag that senses the interrogating RF wave May respond by transmitting back another RF wave. The tag either generates the transmitted back RF wave originally, or by reflecting back a portion of the interrogating RF wave in a process known as backscatter. Backscatter may take place in a number of ways.

The reflected-back RF wave may encode data stored in the tag, such as a number. The response is demodulated and decoded by the reader, which thereby identifies, counts, or otherwise interacts with the associated item. The decoded data can denote a serial number, a price, a date, a time, a destination, an encrypted message, an electronic signature, other attribute(s), any combination of attributes, and so on. Accordingly, when a reader receives tag data it can learn about the item that hosts the tag and/or about the tag itself.

An RFID tag typically includes an antenna section, a radio section, a power-management section, and frequently a logical section, a memory, or both. In some RFID tags the power-management section included an energy storage device such as a battery. RFID tags with an energy storage device are known as battery-assisted, semi-active, or active tags. Other RFID tags can be powered solely by the RF signal they receive. Such RFID tags do not include an energy storage device and are called passive tags. Of course, even passive tags typically include temporary energy- and data/flag-storage elements such as capacitors or inductors.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to rectifiers using a single bias current or bias current path to bias multiple rectifying elements. A rectifier that has multiple rectifier stages coupled together serially includes a bias current path coupled to each of the rectifier stages. Thee bias current path is configured to simultaneously bias rectifying elements in each of the rectifier stages by using a bias current to bias a first rectifying element and reusing the bias current to bias other rectifying elements.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying drawings, in which.

DETAILED DESCRIPTION

In the following detailed description, references are made to the accompanying drawings that form a part hereof, and in which are shown by way of illustration specific embodiments or examples. These embodiments or examples May be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

As used herein, "memory" is one of ROM, RAM, SRAM, DRAM, NVM, EEPROM, FLASH, Fuse, MRAM, FRAM, and other similar information-storage technologies as will be known to those skilled in the art. Some portions of memory may be writeable and some not. "Command" refers to a reader request for one or more tags to perform one or more actions, and includes one or more tag instructions preceded by a command identifier or command code that identifies the command and/or the tag instructions. "Instruction" refers to a request to a tag to perform a single explicit action (e.g., write data into memory). "Program" refers to a request to a tag to perform a set or sequence of instructions (e.g., read a value from memory and, if the read value is less than a threshold then lock a memory word). "Protocol" refers to an industry standard for communications between a reader and a tag (and vice versa), such as the Class-1 Generation-2 UHF RFID Protocol for Communications at 860 MHz-960 MHz by GSI EPCglobal, Inc. ("Gen2 Specification"), versions 1.2.0 and 2.0 of which are hereby incorporated by reference.

Figure 1:
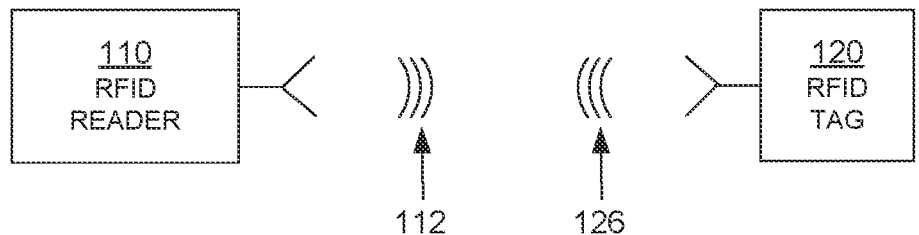
FIG. 1 is a block diagram of components of an RFID system.

FIG. 1 is a diagram of the components of a typical RFID system 100, incorporating embodiments. An RFID reader 110 transmits an interrogating RF signal 112. RFID tag 120 in the vicinity of RFID reader 110 senses interrogating RF signal 112 and generate signal 126 in response. RFID reader 110 senses and interprets signal 126. The signals 112 and 126 may include RF waves and/or non-propagating RF signals (e.g., reactive near-field signals).

Reader 110 and tag 120 communicate via signals 112 and 126. When communicating, each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHZ, 13.56 MHz, and so on.

The communication between reader and tag uses symbols, also called RFID symbols. A symbol can be a delimiter, a calibration value, and so on. Symbols can be implemented for exchanging binary data, such as "0" and "1", if that is desired. When symbols are processed by reader 110 and tag 120 they can be treated as values, numbers, and so on.

Tag 120 can be a passive tag, or an active or battery-assisted tag (i.e., a tag having its own power source). When tag 120 is a passive tag, it is powered from signal 112.

Figure 2:
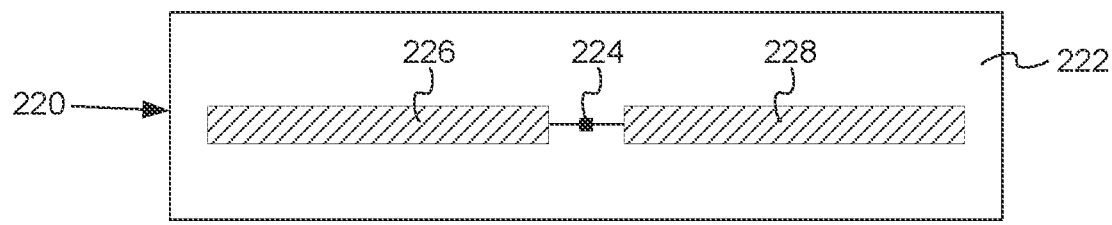
FIG. 2 is a diagram showing components of a passive RFID tag, such as a tag that can be used in the system of FIG. 1.
Figure 2:
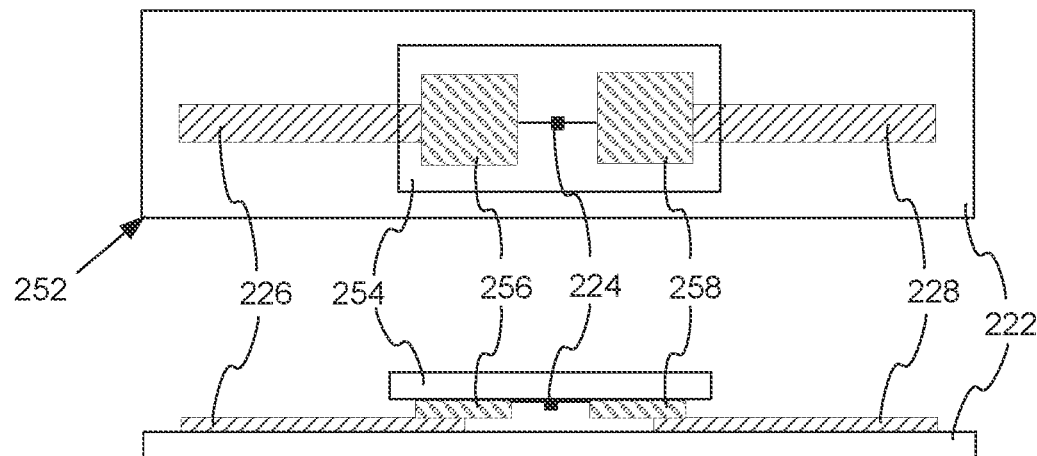
Figure 2:
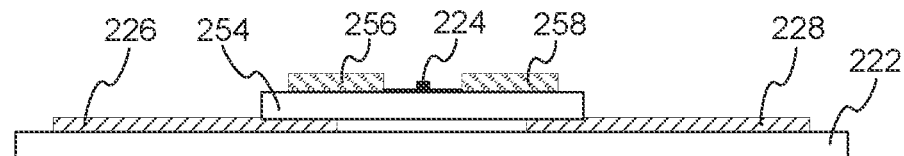

FIG. 2 is a diagram of an RFID tag 220, which may function as tag 120 of FIG. 1. Tag 220 is drawn as a passive tag, meaning it does not have its own power source. Much of what is described in this document, however, applies also to active and battery-assisted tags.

Tag 220 is typically (although not necessarily) formed on a substantially planar inlay 222, which can be made in many ways known in the art. Tag 220 includes a circuit which may be implemented as an IC 224. In some embodiments IC 224 is implemented in complementary metal-oxide semiconductor (CMOS) technology. In other embodiments IC 224 may be implemented in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for exchanging wireless signals with its environment. The antenna is often flat and attached to inlay 222. IC 224 is electrically coupled to the antenna via suitable IC contacts (not shown in FIG. 2). The term "electrically coupled" as used herein may mean a direct electrical connection, or it may mean a connection that includes one or more intervening circuit blocks, elements, or devices. The "electrical" part of the term "electrically coupled" as used in this document shall mean a coupling that is one or more of ohmic/galvanic, capacitive, and/or inductive. Similarly, the term "electrically isolated" as used herein means that electrical coupling of one or more types (e.g., galvanic, capacitive, and/or inductive) is not present, at least to the extent possible. For example, elements that are electrically isolated from each other are galvanically isolated from each other, capacitively isolated from each other, and/or inductively isolated from each other. Of course, electrically isolated components will generally have some unavoidable stray capacitive or inductive coupling between them, but the intent of the isolation is to minimize this stray coupling to a negligible level when compared with an electrically coupled path.

IC 224 is shown with a single antenna port, comprising two IC contacts electrically coupled to two antenna segments 226 and 228 which are shown here forming a dipole. Many other embodiments are possible using any number of ports, contacts, antennas, and/or antenna segments.

Diagram 250 depicts top and side views of tag 252, formed using a strap. Tag 252 differs from tag 220 in that it includes a substantially planar strap substrate 254 having strap contacts 256 and 258. IC 224 is mounted on strap substrate 254 such that the IC contacts on IC 224 electrically couple to strap contacts 256 and 258 via suitable connections (not shown). Strap substrate 254 is then placed on inlay 222 such that strap contacts 256 and 258 electrically couple to antenna segments 226 and 228. Strap substrate 254 may be affixed to inlay 222 via pressing, an interface layer, one or more adhesives, or any other suitable means.

Diagram 260 depicts a side view of an alternative way to place strap substrate 254 onto inlay 222. Instead of strap substrate 254's surface, including strap contacts 256/258, facing the surface of inlay 222, strap substrate 254 is placed with its strap contacts 256/258 facing away from the surface of inlay 222. Strap contacts 256/258 can then be either capacitively coupled to antenna segments 226/228 through strap substrate 254, or conductively coupled using a through-via which may be formed by crimping strap contacts 256/258 to antenna segments 226/228. In some embodiments the positions of strap substrate 254 and inlay 222 may be reversed, with strap substrate 254 mounted beneath inlay 222 and strap contacts 256/258 electrically coupled to antenna segments 226/228 through inlay 222. Of course, in yet other embodiments strap contacts 256/258 may electrically couple to antenna segments 226/228 through both inlay 222 and strap substrate 254.

In operation, the antenna receives a signal and communicates it to IC 224, which may both harvest power and respond if appropriate, based on the incoming signal and the IC's internal state. If IC 224 uses backscatter modulation then it responds by modulating the antenna's reflectance, which generates response signal 126 from signal 112 transmitted by the reader. Electrically coupling and uncoupling the IC contacts of IC 224 can modulate the antenna's reflectance, as can varying the admittance of a shunt-connected circuit element which is coupled to the IC contacts. Varying the impedance of a series-connected circuit element is another means of modulating the antenna's reflectance. If IC 224 is capable of transmitting signals (e.g., has its own power source, is coupled to an external power source, and/or is able to harvest sufficient power to transmit signals), then IC 224 may respond by transmitting response signal 126.

In the embodiments of FIG. 2, antenna segments 226 and 228 are separate from IC 224. In other embodiments the antenna segments may alternatively be formed on IC 224.

Tag antennas according to embodiments may be designed in any form and are not limited to dipoles. For example, the tag antenna may be a patch, a slot, a loop, a coil, a horn, a spiral, a monopole, microstrip, stripline, or any other suitable antenna.

An RFID tag such as tag 220 is often attached to or associated with an individual item or the item packaging. An RFID tag may be fabricated and then attached to the item or packaging, or may be partly fabricated before attachment to the item or packaging and then completely fabricated upon attachment to the item or packaging. In some embodiments, the manufacturing process of the item or packaging may include the fabrication of an RFID tag. In these embodiments, the resulting RFID tag may be integrated into the item or packaging, and portions of the item or packaging may serve as tag components. For example, conductive item or packaging portions may serve as tag antenna segments or contacts. Nonconductive item or packaging portions may serve as tag substrates or inlays. If the item or packaging includes integrated circuits or other circuitry, some portion of the circuitry may be configured to operate as part or all of an RFID tag IC.

The components of the RFID system of FIG. 1 may communicate with each other in any number of modes. One such mode is called full duplex, where both reader 110 and tag 120 can transmit at the same time. In some embodiments, RFID system 100 may be capable of full duplex communication if tag 120 is configured to transmit signals as described above. Another such mode, suitable for passive tags, is called half-duplex, and is described below.

Figure 3:
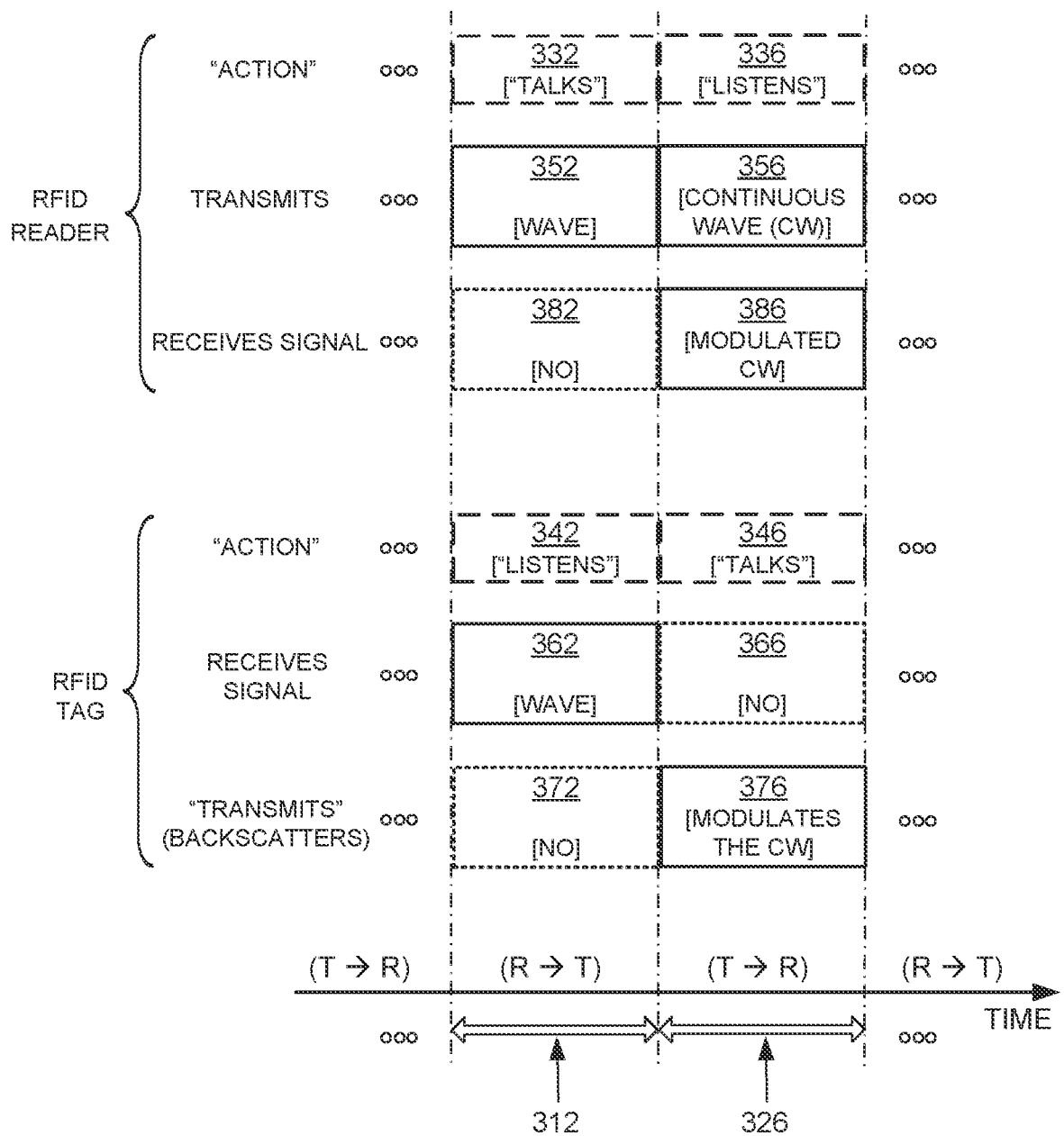
FIG. 3 is a conceptual diagram for explaining a half-duplex mode of communication between the components of the RFID system of FIG. 1.

FIG. 3 is a conceptual diagram 300 for explaining half-duplex communications between the components of the RFID system of FIG. 1, in this case with tag 120 implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 312, and a following sample T→R communication session occurs during a time interval 326. Interval 312 may typically be of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual behavior, during interval 312 reader 110 talks to tag 120 as follows. According to block 352, reader 110 transmits signal 112, which was first described in FIG. 1. At the same time, according to block 362, tag 120 receives signal 112 and processes it to extract data and so on. Meanwhile, according to block 372, tag 120 does not backscatter with its antenna, and according to block 382, reader 110 has no signal to receive from tag 120.

During interval 326, tag 120 talks to reader 110 as follows. According to block 356, reader 110 transmits a Continuous Wave (CW) signal, which can be thought of as a carrier that typically encodes no information. This CW signal serves both to transfer energy to tag 120 for its own internal power needs, and also as a carrier that tag 120 can modulate with its backscatter. Indeed, during interval 326, according to block 366, tag 120 does not receive a signal for processing. Instead, according to block 376, tag 120 modulates the CW emitted according to block 356 so as to generate backscatter signal 126. Concurrently, according to block 386, reader 110 receives backscatter signal 126 and processes it.

Figure 4:
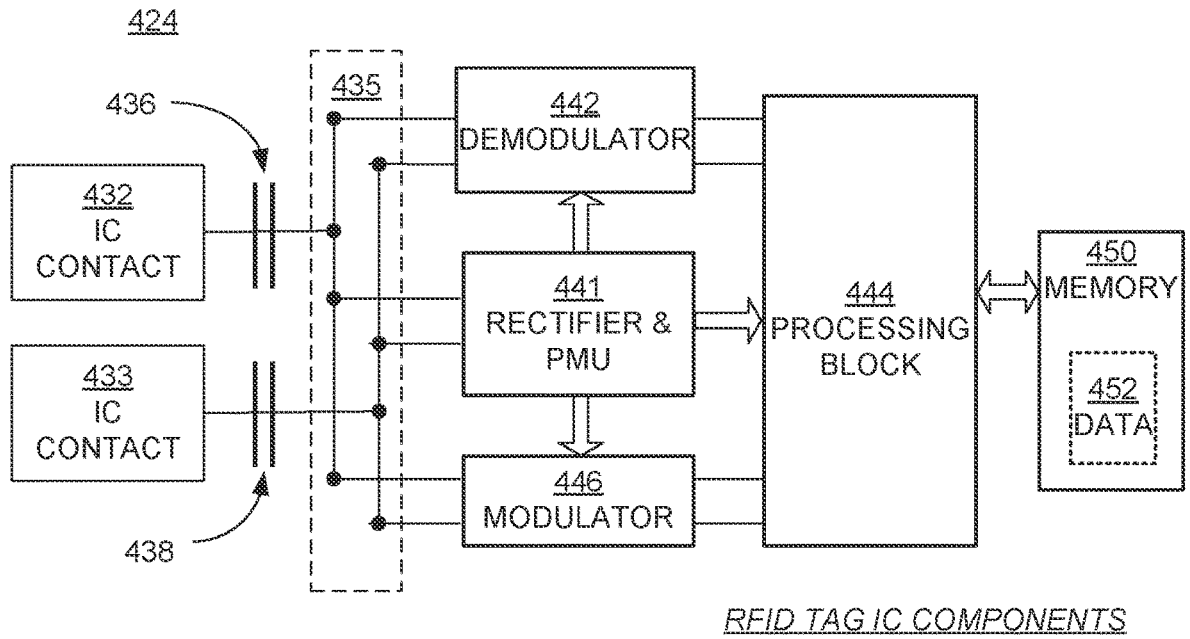
FIG. 4 is a block diagram showing a detail of an RFID tag, such as the one shown in FIG. 2.

FIG. 4 is a block diagram showing a detail of an RFID IC, such as IC 224 in FIG. 2. Electrical circuit 424 in FIG. 4 may be formed in an IC of an RFID tag, such as tag 220 of FIG. 2. Circuit 424 has a number of main components that are described in this document. Circuit 424 may have a number of additional components from what is shown and described, or different components, depending on the exact implementation.

Circuit 424 shows two IC contacts 432, 433, suitable for coupling to antenna segments such as antenna segments 226/228 of RFID tag 220 of FIG. 2. When two IC contacts form the signal input from and signal return to an antenna they are often referred-to as an antenna port. IC contacts 432, 433 may be made in any suitable way, such as from metallic pads and so on. In some embodiments circuit 424 uses more than two IC contacts, especially when tag 220 has more than one antenna port and/or more than one antenna.

Circuit 424 includes signal-routing section 435 which may include signal wiring, signal-routing busses, receive/transmit switches, and so on that can route a signal to the components of circuit 424. In some embodiments IC contacts 432/433 couple galvanically and/or inductively to signal-routing section 435. In other embodiments (such as is shown in FIG. 4) circuit 424 includes optional capacitors 436 and/or 438 which, if present, capacitively couple IC contacts 432/433 to signal-routing section 435. This capacitive coupling causes IC contacts 432/433 to be galvanically decoupled from signal-routing section 435 and other circuit components.

Capacitive coupling (and resultant galvanic decoupling) between IC contacts 432 and/or 433 and components of circuit 424 is desirable in certain situations. For example, in some RFID tag embodiments IC contacts 432 and 433 may galvanically connect to terminals of a tuning loop on the tag. In this situation, capacitors 436 and/or 438 galvanically decouple IC contact 432 from IC contact 433, thereby preventing the formation of a short circuit between the IC contacts through the tuning loop.

Capacitors 436/438 may be implemented within circuit 424 and/or partly or completely external to circuit 424. For example, a dielectric or insulating layer on the surface of the IC containing circuit 424 may serve as the dielectric in capacitor 436 and/or capacitor 438. As another example, a dielectric or insulating layer on the surface of a tag substrate (e.g., inlay 222 or strap substrate 254) may serve as the dielectric in capacitors 436/438. Metallic or conductive layers positioned on both sides of the dielectric layer (i.e., between the dielectric layer and the IC and between the dielectric layer and the tag substrate) may then serve as terminals of the capacitors 436/438. The conductive layers may include IC contacts (e.g., IC contacts 432/433), antenna segments (e.g., antenna segments 226/228), or any other suitable conductive layers.

Circuit 424 also includes a rectifier and PMU (Power Management Unit) 441 that harvests energy from the RF signal received by antenna segments 226/228 to power the circuits of IC 424 during either or both reader-to-tag (R→T) and tag-to-reader (T→R) sessions. Rectifier and PMU 441 may be implemented in any way known in the art.

Circuit 424 additionally includes a demodulator 442 that demodulates the RF signal received via IC contacts 432, 433. Demodulator 442 may be implemented in any way known in the art, for example including a slicer, an amplifier, and so on.

Circuit 424 further includes a processing block 444 that receives the output from demodulator 442 and performs operations such as command decoding, memory interfacing, and so on. In addition, processing block 444 may generate an output signal for transmission. Processing block 444 may be implemented in any way known in the art, for example by combinations of one or more of a processor, memory, decoder, encoder, and so on.

Circuit 424 additionally includes a modulator 446 that modulates an output signal generated by processing block 444. The modulated signal is transmitted by driving IC contacts 432, 433, and therefore driving the load presented by the coupled antenna segment or segments. Modulator 446 may be implemented in any way known in the art, for example including a switch, driver, amplifier, and so on.

In one embodiment, demodulator 442 and modulator 446 may be combined in a single transceiver circuit. In another embodiment modulator 446 may modulate a signal using backscatter. In another embodiment modulator 446 may include an active transmitter. In yet other embodiments demodulator 442 and modulator 446 may be part of processing block 444.

Circuit 424 additionally includes a memory 450 to store data 452. At least a portion of memory 450 is preferably implemented as a Nonvolatile Memory (NVM), which means that data 452 is retained even when circuit 424 does not have power, as is frequently the case for a passive RFID tag.

In some embodiments, particularly in those with more than one antenna port, circuit 424 may contain multiple demodulators, rectifiers, PMUs, modulators, processing blocks, and/or memories.

In terms of processing a signal, circuit 424 operates differently during a R→T session and a T→R session. The different operations are described below, in this case with circuit 424 representing an IC of an RFID tag.

Figure 5A:
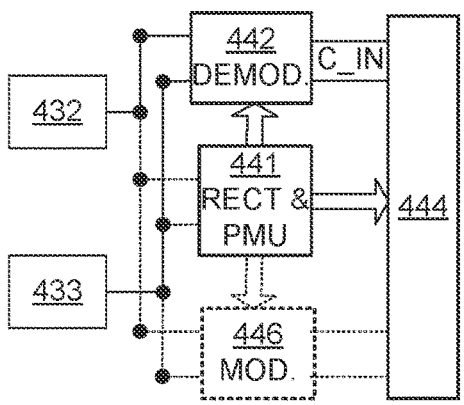
FIGS. 5A and 5B illustrate signal paths during tag-to-reader and reader-to-tag communications in the block diagram of FIG. 4.

FIG. 5A shows version 524-A of components of circuit 424 of FIG. 4, further modified to emphasize a signal operation during a R→T session during time interval 312 of FIG. 3. Demodulator 442 demodulates an RF signal received from IC contacts 432, 433. The demodulated signal is provided to processing block 444 as C_IN. In one embodiment, C_IN may include a received stream of symbols.

Version 524-A shows as relatively obscured those components that do not play a part in processing a signal during a R→T session. Rectifier and PMU 441 may be active, such as for converting RF power. Modulator 446 generally does not transmit during a R→T session, and typically does not interact with the received RF signal significantly, either because switching action in section 435 of FIG. 4 decouples modulator 446 from the RF signal, or by designing modulator 446 to have a suitable impedance, and so on.

Although modulator 446 is typically inactive during a R→T session, it need not be so. For example, during a R→T session modulator 446 could be adjusting its own parameters for operation in a future session, and so on.

Figure 5B:
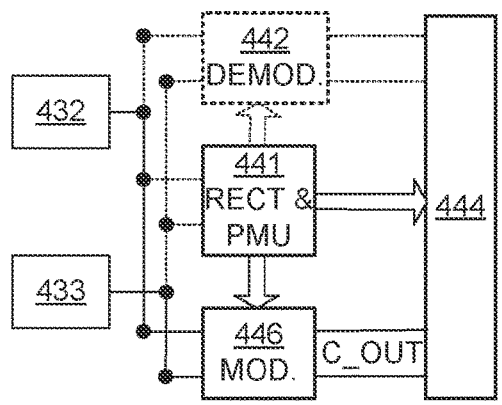

FIG. 5B shows version 524-B of components of circuit 424 of FIG. 4, further modified to emphasize a signal operation during a T→R session during time interval 326 of FIG. 3. Processing block 444 outputs a signal C_OUT. In one embodiment, C_OUT may include a stream of symbols for transmission. Modulator 446 then modulates C_OUT and provides it to antenna segments such as segments 226/228 of RFID tag 220 via IC contacts 432, 433.

Version 524-B shows as relatively obscured those components that do not play a part in processing a signal during a T→R session. Rectifier and PMU 441 may be active, such as for converting RF power. Demodulator 442 generally does not receive during a T→R session, and typically does not interact with the transmitted RF signal significantly, either because switching action in section 435 of FIG. 4 decouples demodulator 442 from the RF signal, or by designing demodulator 442 to have a suitable impedance, and so on.

Although demodulator 442 is typically inactive during a T→R session, it need not be so. For example, during a T→R session demodulator 442 could be adjusting its own parameters for operation in a future session, and so on.

In typical embodiments, demodulator 442 and modulator 446 are operable to demodulate and modulate signals according to a protocol, such as the Gen2 Specification mentioned above. In embodiments where circuit 424 includes multiple demodulators and/or modulators, each may be configured to support different protocols or different sets of protocols. A protocol specifies, in part, symbol encodings, and may include a set of modulations, rates, timings, or any other parameter associated with data communications. In addition, a protocol can be a variant of a stated specification such as the Gen2 Specification, for example including fewer or additional commands than the stated specification calls for, and so on. In such instances, additional commands are sometimes called custom commands.

In some embodiments, the performance of a rectifier or charge pump may be improved by biasing one or more rectifying elements in the rectifier/charge pump. "Biasing" refers to the application of a voltage or current (the "bias") at one or more points in a circuit to place one or more components in that circuit into a desired operating state. Bias may be in the form of a direct current (DC) or non-time-varying voltage or current. For example, if transistors are used as rectifying elements, DC or non-time-varying biases may be applied to the gates of transistors.

Figure 6:
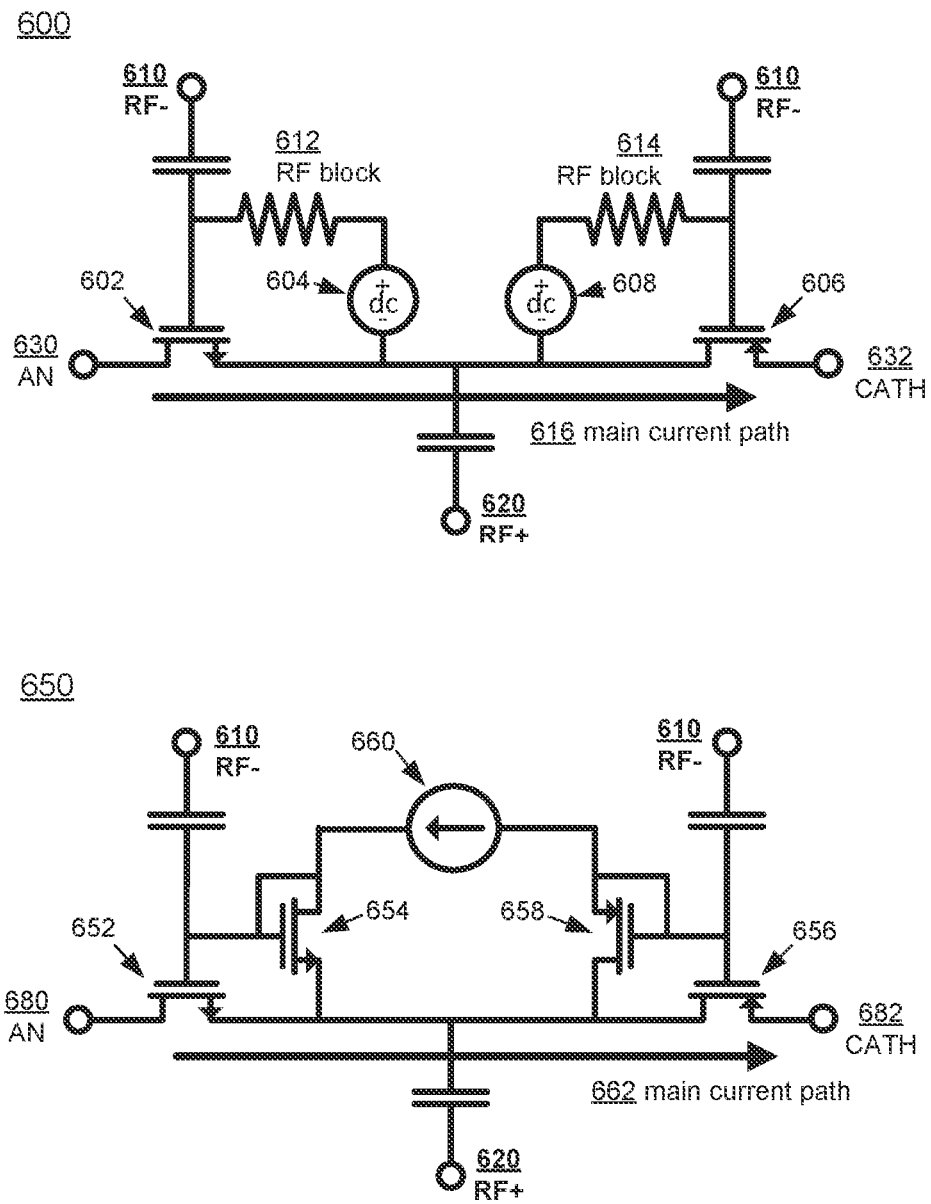
FIG. 6 illustrates the biasing of rectifier stages.

FIG. 6 illustrates the biasing of rectifier stages 600 and 650. In rectifier stage 600, biasing is provided via a DC voltage bias, which may be referred to as "voltage-biasing". Rectifier stage 600, which may be one of several stages in a rectifier, includes an n-channel metal-oxide semiconductor (NMOS) transistor 602 and a complementary p-channel metal-oxide semiconductor (PMOS) transistor 606, arranged to serve as rectifying elements along a main current path 616. The main current path 616 for rectifier stage 600 begins at anode 630, which is also the drain of transistor 602. The main current path 616 then passes through the source of transistor 602, which is coupled to an RF+ input 620 via a coupling capacitor and to the drain of transistor 606. The main current path 616 then passes through the source of transistor 606, which serves as cathode 632.

The gate of transistor 602 is coupled, via a coupling capacitor, to an RF− input 610, which has a different phase than RF+ input 620. The gate of transistor 602 is also coupled to DC bias 604 via RF block 612, which serves to isolate the RF signal originating from RF− input 610 and the DC signal provided by DC bias 604. The DC bias 604 is then coupled to the source of transistor 602. As a result, transistor 602 is voltage-biased, where the bias value is based on the voltage provided by DC bias 604.

The gate of transistor 606, like the gate of transistor 602, is also coupled to the RF− input 610 via a coupling capacitor.

The gate of transistor 606 is further coupled to DC bias 608 via RF block 614, which serves to isolate the RF signal originating from RF− input 610 and the DC signal provided by DC bias 608. The DC bias 608 is then coupled to the source of transistor 606, thereby voltage-biasing transistor 606.

In rectifier stage 650, biasing is provided via current flowing through biasing transistors, which may be referred to as "current-biasing". Rectifier stage 650, which may be one of several stages in a rectifier, includes NMOS transistor 652 and PMOS transistor 656, arranged to serve as rectifying elements along a main current path 662. The main current path 662 begins at anode 680, which is also the drain of transistor 652. The main current path 662 then passes through the source of transistor 652, which is coupled to the drain of transistor 656 and also to the RF+ input 620 via a coupling capacitor. The main current path 662 then passes through the source of transistor 656, which serves as cathode 682.

The gate of transistor 652 is coupled, via a coupling capacitor, to RF− input 610. A biasing NMOS transistor 654 is disposed between the gate and source of transistor 652, where the gate and source of biasing transistor 654 are coupled to the gate and source, respectively, of transistor 652. The gate of biasing transistor 654 is coupled to its drain and to the output of current source 660. This configuration causes biasing transistor 654 to provide a voltage bias between the gate and source of transistor 652, where the voltage bias value is based on the current provided by the current source 660.

Transistor 656 is configured similarly to transistor 652. The gate of transistor 656 is coupled, via a coupling capacitor, to RF− input 610. A biasing PMOS transistor 658 is disposed between the gate and drain of transistor 656, where the gate and drain of biasing transistor 658 are coupled to the gate and drain, respectively, of transistor 656. The gate of biasing transistor 658 is coupled to its source and to the input of current source 660. This configuration causes biasing transistor 658 to provide a voltage bias between the gate and drain of transistor 656, where the voltage bias value is based on the current associated with the current source 660.

Figure 7:
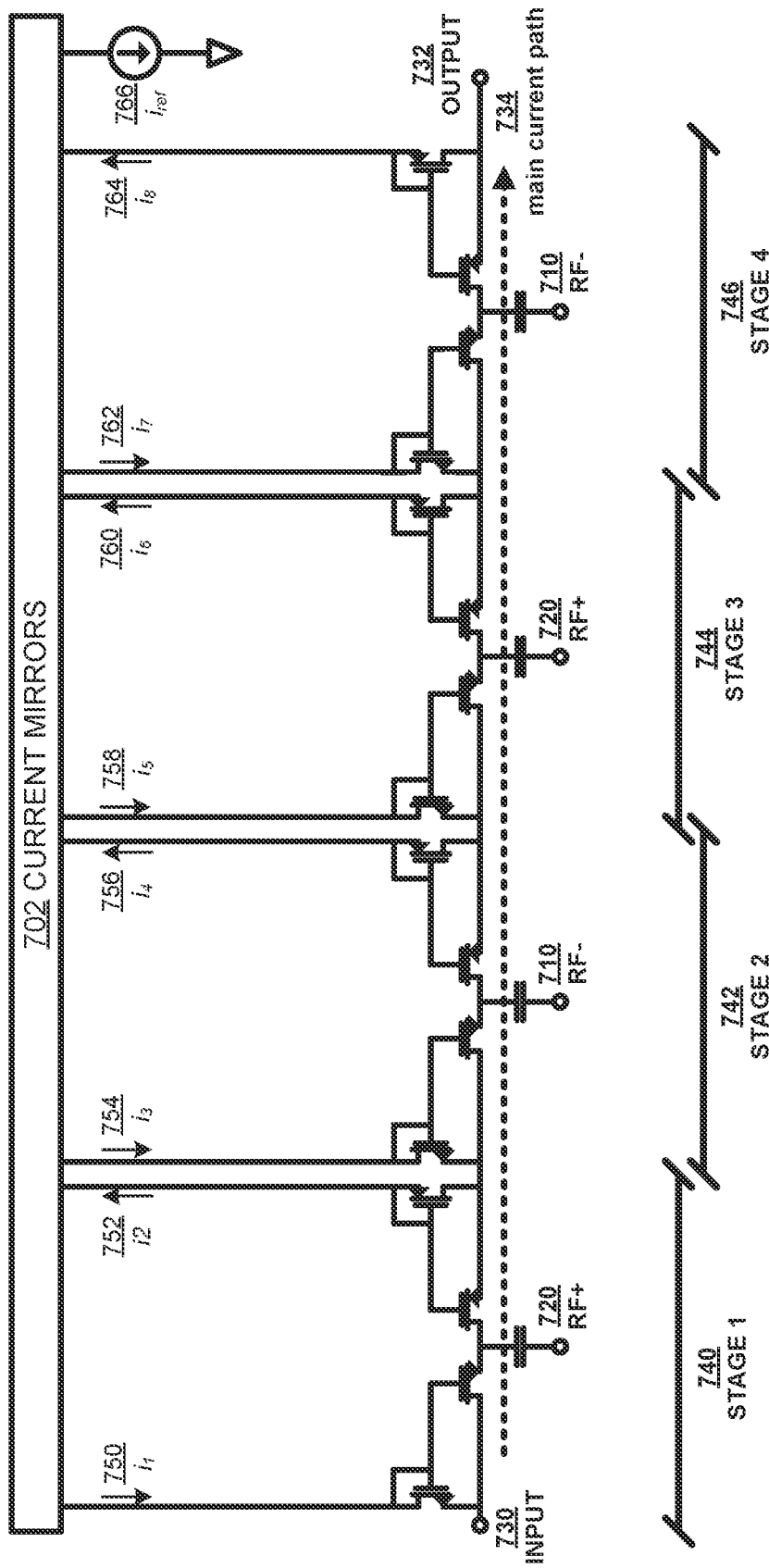
FIG. 7 illustrates a central biasing scheme for a multi-stage rectifier involving many biasing currents.

FIG. 7 illustrates a central biasing scheme for a multi-stage rectifier 700 involving many biasing currents. In a multi-stage rectifier central biasing scheme, the biasing of individual rectifier stages is controlled via a central voltage or current. Multi-stage rectifier 700 includes four rectifier stages 740, 742, 744, and 746. Each of the rectifier stages 740-746 are coupled to an RF input, either an RF− input 710 or an RF+ input 720, and in concert act to use RF signals on the inputs 710 and 720 to generate current in a main current path 734 extending from an input 730 to an output 732. Each rectifier stage is current-biased, similar to rectifier stage 650, with stage 740 biased via currents 750 and 752, stage 742 biased via currents 754 and 756, stage 744 biased via currents 758 and 760, and stage 746 biased via currents 762 and 764. The bias currents 750-764 are generated via current mirrors 702 from a reference current 766.

The central biasing scheme illustrated in FIG. 7 involves generating many bias currents. Each of the rectifier stages requires at least two bias currents, so the four-stage rectifier 700 requires at least eight bias currents, each with their own bias current path. When using current mirrors, each different bias current may require a different current mirror, in turn requiring significant circuitry (and IC area) for implementation. If the number of bias currents can be reduced, the circuitry and IC area required for current mirrors can also be reduced.

Figure 8:
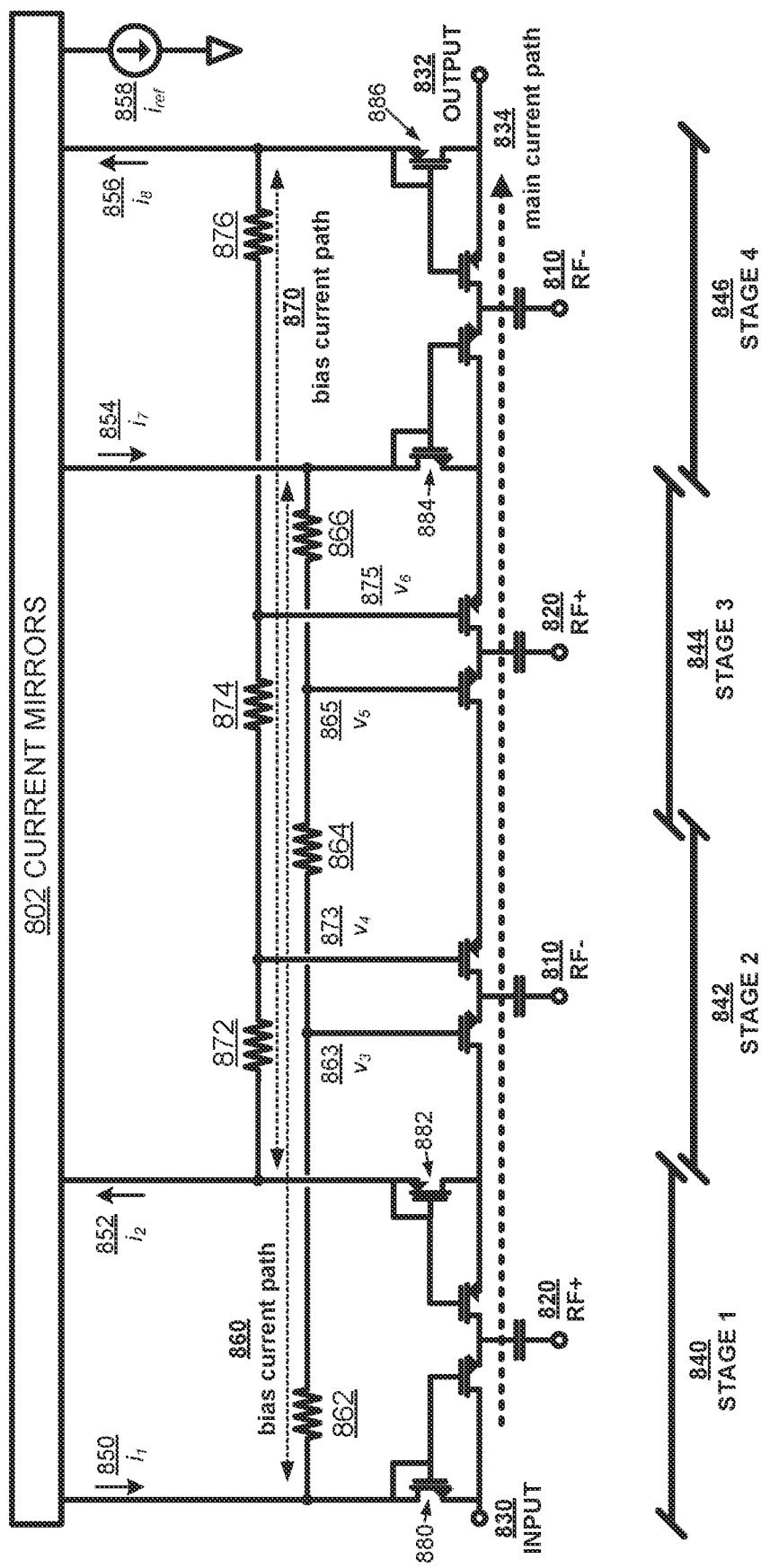
FIG. 8 depicts a central biasing scheme for a multi-stage rectifier involving current reuse, according to embodiments.

FIG. 8 depicts a central biasing scheme for a multi-stage rectifier 800 involving current reuse, according to embodiments. Multi-stage rectifier 800, similar to rectifier 700, includes four rectifier stages 840, 842, 844, and 846, each coupled to an RF− input 810 or an RF+ input 820 and serially coupled together to provide a main current path 834 from input 830 to output 832. As in FIG. 7, the rectifier stages 840-846 use RF signals on inputs 810 and 820 to generate a current on main current path 834. In contrast to FIG. 7, the four rectifier stages 840-846 are biased only with four biasing currents 850, 852, 854, and 856, generated via current mirrors 802 from a reference current 858. This is accomplished by using bias currents to current-bias two rectifier stages (840 and 846) and reusing the bias currents to simultaneously voltage-bias the other two rectifier stages (842 and 844).

Bias currents 850 and 852 are used to current-bias stage 840, while bias currents 854 and 856 are used to current-bias stage 846. Bias currents 850 and 852 flow through bias current paths that have terminations at biasing transistors 880 and 882, respectively. The bias currents flowing through biasing transistors 880 and 882 cause the biasing transistors 880 and 882 to provide biasing for rectifying elements in stage 840. Similarly, bias currents 854 and 856 flow through bias current paths that have terminations at biasing transistors 884 and 886, respectively. The bias currents flowing through biasing transistors 884 and 886 to provide biasing for rectifying elements in stage 846.

A first ladder of resistive elements 862, 864, and 866, arranged sequentially, couple bias currents 850 and 854, forming a bias current path 860 that allows current flow between bias currents 850 and 854. Differences between bias currents 850 and 854 generate a bias current that is carried by bias current path 860 and provides bias voltages 863 (between elements 862 and 864) and 865 (between elements 864 and 866) for stages 842 and 844, respectively. A second ladder of resistive elements 872, 874, and 876, arranged sequentially, couple bias currents 852 and 856, forming a bias current path 870 that allows current flow between bias currents 852 and 856.

Similarly, differences between bias currents 852 and 856 generate a bias current that is carried by bias current path 870 and provides bias voltages 873 (between consecutive elements 872 and 874) and 875 (between consecutive elements 874 and 876) for stages 842 and 844, respectively.

The resistive elements 862-866 and 872-876 are selected such that the bias voltages between consecutive elements (e.g., bias voltages 863, 865, 873, and 875) are appropriately-sized to bias their corresponding rectifying elements. For example, the resistive elements may be selected such that the bias voltages track or follow a corresponding voltage on the main current path 834. Resistive elements such as the resistive elements 862-866 and 872-876 may be implemented using any suitable component or device. For example, a resistive element may include a resistor, a variable resistor, one or more transistors (an example of which is described in FIG. 9 below), and/or any other device or component capable of provide an electrical resistance or impedance.

As a result, bias currents used to current-bias particular rectifier stages can be reused, via bias current paths created by resistive ladders with appropriately-chosen resistive elements, to voltage-bias multiple rectifier stages. In rectifier 800, bias current paths with three resistive elements each enable four bias currents, via six bias current paths, to bias four rectifier stages via bias current reuse, but additional resistive elements can be added to enable biasing of additional rectifier stages without having to add additional bias currents or bias current paths.

In some embodiments, four different bias currents may not be needed to bias rectifier 800, and accordingly one or more of bias currents 850, 852, 854, and 856 may be omitted. In one embodiment bias currents 850 and 856 may be omitted. In this embodiment, bias current 854 provides the bias currents passing through bias current path 860, biasing transistor 880, and biasing transistor 884. Similarly, bias current 852 may provide the bias currents passing through bias current path 870, biasing transistor 882, and biasing transistor 886. Accordingly, only two bias currents may be used to bias the four rectifier stages 840-846, and any number of additional stages.

Figure 9:
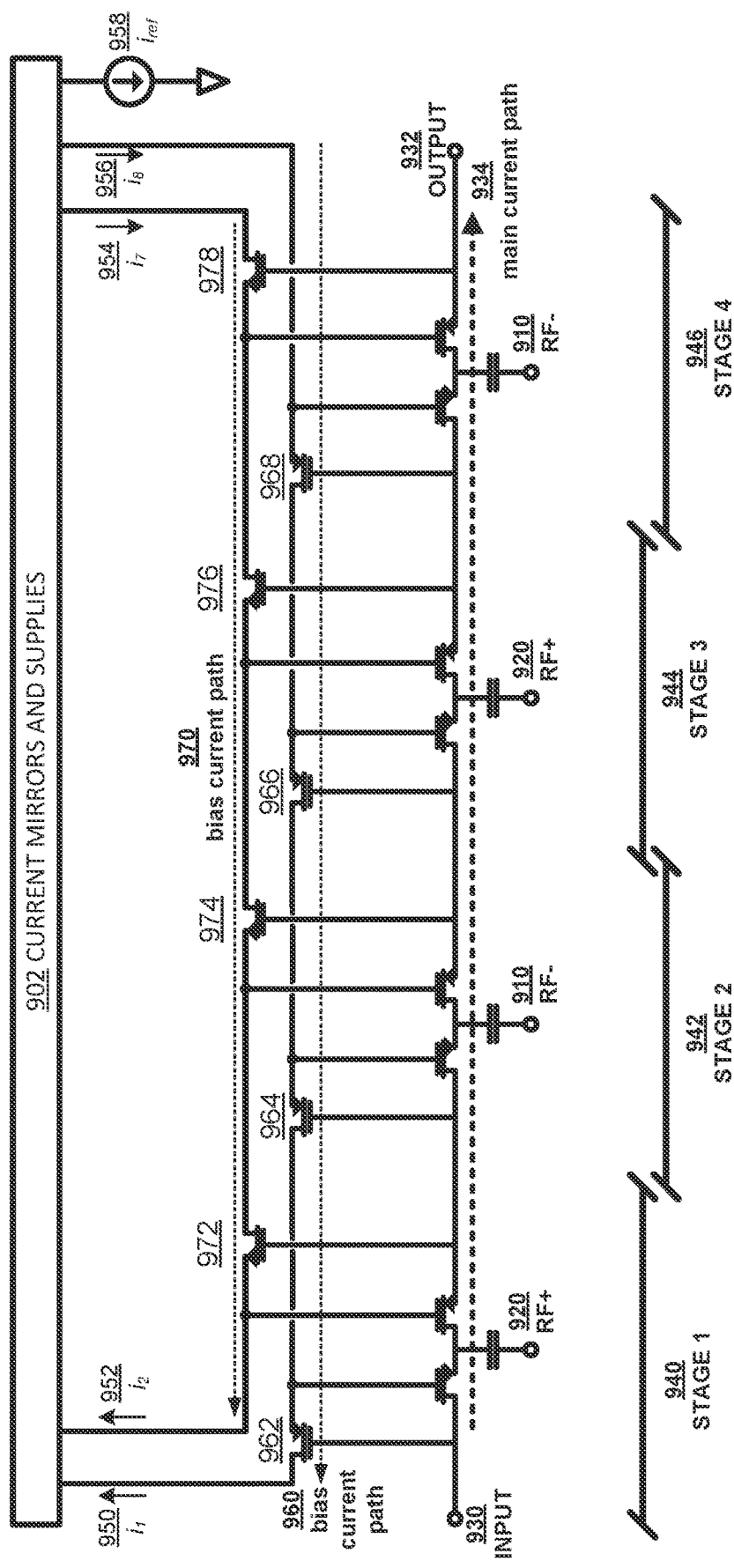
FIG. 9 depicts another central biasing scheme for a multi-stage rectifier involving current reuse, according to embodiments.

FIG. 9 depicts another central biasing scheme for a multi-stage rectifier 900 involving current reuse, according to embodiments. Multi-stage rectifier 900, similar to rectifier 800, includes four rectifier stages 940, 942, 944, and 946, each coupled to an RF− input 910 or an RF+ input 920 and serially coupled together to generate current (via RF signals on inputs 910/920) on a main current path 934 extending from input 930 to output 932. However, the four rectifier stages 940-946 are simultaneously voltage-biased using four biasing currents 950, 952, 954, and 956, generated via current mirrors and supplies 902 from a reference current 958. A first ladder of sequentially-arranged elements 962, 964, 966, and 968 form a bias current path 960 that connects bias currents 950 and 956, and a second ladder of sequentially-arranged elements 972, 974, 976, and 978 form a bias current path 970 that connects bias currents 952 and 954. Elements 962-968 are PMOS biasing transistors in source-follower configuration arranged to provide successively lower voltage biasing (from right to left) to NMOS rectifying transistors in each rectifier stage. The source voltage of each of the PMOS biasing transistors may be used to bias its associated NMOS rectifying transistor, and elements 972-978 are NMOS biasing transistors in source-follower configuration arranged to provide successively lower voltage biasing (from right to left) to PMOS rectifying transistors in each rectifier stage. In some embodiments, the voltage between two consecutive biasing transistors is used to bias an associated rectifying transistor. In order to maintain appropriate biasing voltage, the gates of the biasing transistors may be coupled to the main current path 934, allowing the biasing voltages to track or follow appropriate voltages on the main current path 934. The bias currents 950-956 are configured such that substantial bias current flows through bias current paths 960 and 970. In some embodiments, bias current 950 may be substantially equivalent to bias current 956, and bias current 952 may be substantially equivalent to bias current 954. In this example, only two different bias currents (aside from the reference current) and two different bias current paths (960 and 970) may be needed to centrally-bias the four-stage rectifier 900. Rectifiers with more or fewer than four stages can also be centrally-biased with this technique, without having to add additional bias currents or bias current paths.

Figure 10:
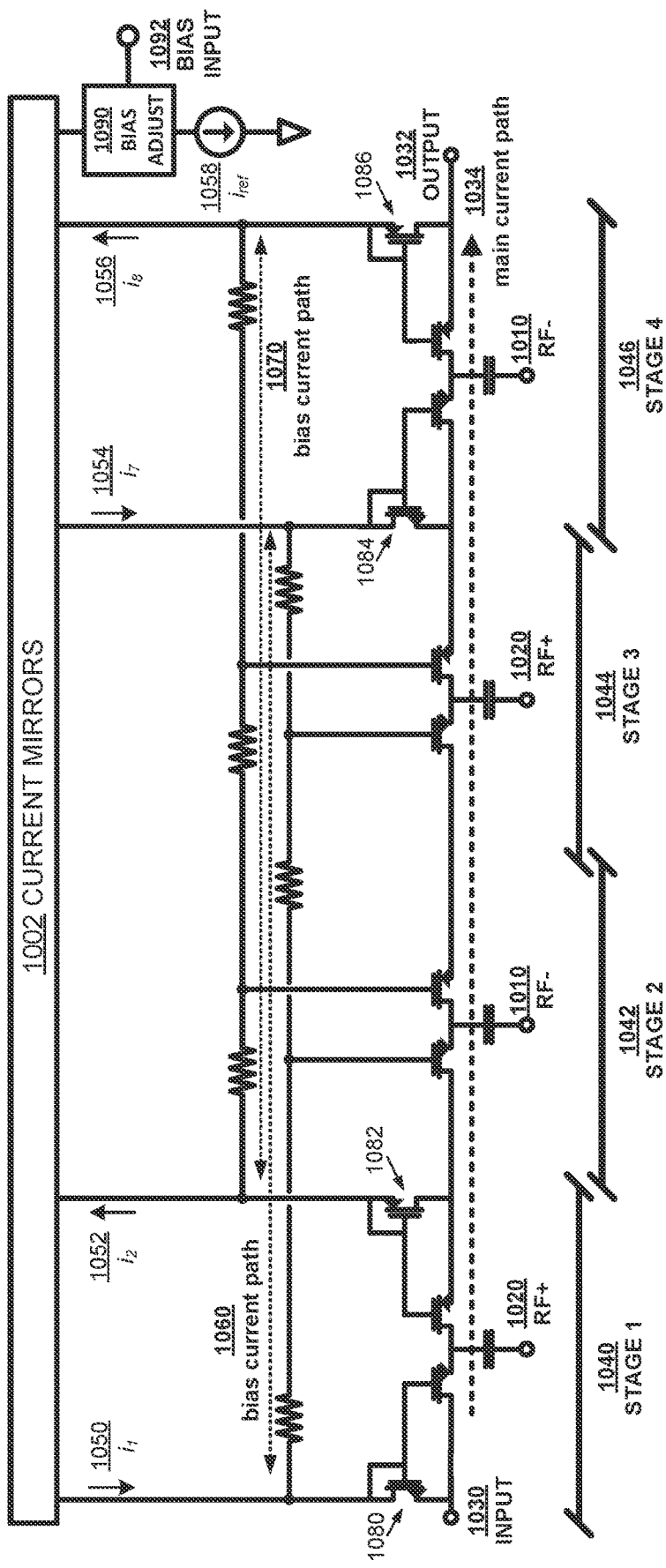
FIG. 10 depicts a multi-stage rectifier with central bias adjustment and current reuse, according to embodiments.

FIG. 10 depicts a multi-stage rectifier 1000 with central bias adjustment and current reuse, according to embodiments. Multi-stage rectifier 1000, similar to rectifier 800, includes four rectifier stages 1040, 1042, 1044, and 1046, each coupled to an RF− input 1010 or an RF+ input 1020 and serially coupled together to generate current (via RF signals on inputs 1010/1020) on a main current path 1034 from input 1030 to output 1032. Biasing currents 1050-1056 simultaneously bias the rectifier stages via bias current paths 1060 and 1070, similar to the biasing of rectifier stages 840-846.

FIG. 10 further depicts a bias adjust controller 1090 coupled to reference current 1058 and current mirrors 1002. Bias adjust controller 1090 is configured to adjust the current output by the reference current 1058, thereby controlling the biasing of the rectifier 1000. The bias adjust controller 1090 adjusts the output current based on a bias input 1092. The bias input 1092 can be configured to receive any suitable inputs for rectifier bias adjustment. For example, the bias input 1092 could be configured to receive bias setting values, desired bias currents, desired bias voltages, one or more indicators of whether biasing should be performed, or any other suitable data.

In some embodiments, rectifier biasing may also be adjusted by controlling the current-biasing transistors. Rectifier 1000 includes biasing transistors 1080-1086. Bias currents originating from biasing currents 1050-1056 cause biasing transistors 1080-1086 to provide biasing for rectifying elements in stages 1040 and 1046. In some embodiments, biasing transistors 1080-1086 may be controlled to adjust their bias voltages without necessarily adjusting the biasing currents 1050-1056. For example, the biasing transistors may contain multiple transistor segments connected in series and/or parallel with digitally controlled switch transistors to configure which segments are used, thus allowing the bias voltage resulting from the bias current to be determined by the digital input to the switches. In other embodiments, analog means for controlling the biasing transistors may be used, such as adjusting transistor well voltages, or adjusting the bias currents into the biasing transistors. Adjusting the bias voltages provided by biasing transistors 1080-1086 not only adjusts the biasing applied to stages 1040 and 1046, but also adjusts the bias voltages on bias current paths 1060 and 1070 and therefore the biasing of stages 1042 and 1044, thereby adjusting the biasing of the entire rectifier 1000.

Rectifier biasing may be adjusted for any reason. In some embodiments, rectifier biasing may be adjusted to increase or decrease rectifying efficiency. Increasing a rectifier's rectifying efficiency may address situations where power delivery from the rectifier is undesirably low, preventing other components from operating. Decreasing the rectifier's rectifying efficiency may address situations where power delivery from the rectifier is undesirably high, potentially causing undesirable effects and damage to other components. In some embodiments, rectifier biasing may be adjusted to change the input impedance presented by the rectifier. The rectifier input impedance in turn affects the input impedance of an RFID IC containing the rectifier, which then affects how the IC couples with an antenna and interacts with RF waves. For example, rectifier biasing and input impedance may be adjusted to control impedance matching between the IC and a coupled antenna, or to control impedance differences between different backscatter states, as described in co-pending and commonly-assigned U.S. patent application Ser. No. 15/888,916, herein incorporated by reference in its entirety.

The bias current paths described herein are depicted as originating from and terminating at current mirrors. However, bias current paths may originate from and/or terminate at any suitable location. For example, bias current paths may originate from and/or terminate at a main current path of a rectifier or rectifier stage. Bias current paths may also originate from and/or terminate at locations external to a rectifier or rectifier stage, or originate from and/or terminate at any other suitable location, such as a ground, virtual ground, and/or reference potential.

While FIGS. 8-10 depict multi-stage rectifiers with four rectifier stages, the concepts described herein are applicable to multi-stage rectifiers with more or fewer stages. For example, bias current reuse may enable the implementation of a rectifier with any desired number of stages, where the number of stages exceeds the number of bias current paths in the rectifier.

The foregoing detailed description has set forth various embodiments of the devices and/or processes via the use of block diagrams and/or examples. Insofar as such block diagrams and/or examples contain one or more functions and/or aspects, it will be understood by those within the art that each function and/or aspect within such block diagrams or examples may be implemented individually and/or collectively, by a wide range of hardware, software, firmware, or virtually any combination thereof. Those skilled in the art will recognize that some aspects of the RFID embodiments disclosed herein, in whole or in part, may be equivalently implemented employing integrated circuits, as one or more computer programs running on one or more computers (e.g., as one or more programs running on one or more computer systems), as one or more programs running on one or more processors (e.g. as one or more programs running on one or more microprocessors), as firmware, or as virtually any combination thereof, and that designing the circuitry and/or writing the code for the software and/or firmware would be well within the skill of one of skill in the art in light of this disclosure.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, configurations, antennas, transmission lines, and the like, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"): the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

We claim:

1. A rectifier for a Radio Frequency Identification (RFID) integrated circuit (IC), the rectifier comprising:
 a plurality of rectifier stages, each rectifier stage having at least one rectifying element, the rectifying elements in the rectifier stages forming a main current path of the rectifier; and
 a bias current path different from the main current path and configured to direct a single bias current to simultaneously bias a respective rectifying element of each of the rectifier stages of the plurality of rectifier stages by using the single bias current to at least partly current-bias a first rectifying element in a first rectifier stage of the plurality of rectifier stages and reusing the single bias current to voltage-bias at least a second rectifying element in at least a second rectifier stage of the plurality of rectifier stages.

2. The rectifier of claim 1, further comprising another bias current path, wherein:
the at least one rectifying element in each of the rectifier stages includes an NMOS transistor and a PMOS transistor;
the bias current path is configured to direct a first bias current to simultaneously bias a respective NMOS transistor of each of the rectifier stages; and
the other bias current path is configured to direct a second bias current to simultaneously bias a respective PMOS transistor of each of the rectifier stages.

3. The rectifier of claim 1, wherein:
a biasing transistor is configured to current-bias the first rectifying element; and
a gate of the second rectifying element is voltage-biased.

4. The rectifier of claim 1, wherein:
the bias current path includes a ladder of resistive elements arranged sequentially, and
a voltage between two adjacent resistive elements of the ladder tracks a corresponding voltage on the main current path.

5. The rectifier of claim 4, wherein the resistive elements include source-follower-configured transistors.

6. The rectifier of claim 1, wherein the bias current path originates from and/or terminates at one or more current mirrors.

7. The rectifier of claim 1, wherein the bias current path originates from and/or terminates at the main current path.

8. The rectifier of claim 1, wherein the bias current path originates from and/or terminates at another rectifier.

9. A method to bias a rectifier having a plurality of rectifier stages coupled together serially, the method comprising:
providing, through a main current path of the rectifier, a main current to at least one rectifying element of each rectifier stage of the plurality of rectifier stages, wherein rectifying elements in the plurality of rectifier stages form the main current path of the rectifier; and
providing, through a bias current path different from the main current path, a first bias current to simultaneously bias a respective rectifying element of each of the plurality of rectifier stages by using the first bias current to at least partly current-bias a first rectifying element in a first rectifier stage of the plurality of rectifier stages and reusing the first bias current to voltage-bias at least a second rectifying element in at least a second rectifier stage of the plurality of rectifier stages.

10. The method of claim 9, further comprising:
providing, through another bias current path different from the bias current path, a second bias current, wherein
the at least one rectifying element in each of the plurality of rectifier stages includes an NMOS transistor and a PMOS transistor;
the first bias current is configured to simultaneously bias a respective NMOS transistor of each of the plurality of rectifier stages; and
the second bias current is configured to simultaneously bias a respective PMOS transistor of each of the plurality of rectifier stages.

11. The method of claim 9, further comprising:
using a biasing transistor configured to current-bias the first rectifying element; and
voltage-biasing a gate of the at least second rectifying element.

12. The method of claim 9, wherein the bias current path includes a ladder of resistive elements arranged sequentially, and the method further comprises:
causing a voltage between two adjacent resistive elements of the ladder to track a corresponding voltage on the main current path.

13. The method of claim 12, wherein the resistive elements include source-follower-configured transistors.

14. The method of claim 9, wherein the bias current path originates from and/or terminates at:
one or more current mirrors,
the main current path, or
another rectifier.

15. A rectifier comprising:
at least three rectifier stages, each of the rectifier stages having at least one rectifying element, the rectifying elements in the at least three rectifier stages forming at least part of a main current path of the rectifier; and
a bias current path different from the main current path and configured to direct a single bias current to simultaneously bias a respective rectifying element of each of the at least three rectifier stages by using the single bias current to at least partly current-bias a first rectifying element in a first rectifier stage of the plurality of rectifier stages and reusing the single bias current to voltage-bias at least a second rectifying element in at least a second rectifier stage of the plurality of rectifier stages.

16. The rectifier of claim 15, further comprising another bias current path, wherein:
the at least one rectifying element in each of the rectifier stages includes an NMOS transistor and a PMOS transistor;
the bias current path is configured to direct a first bias current to simultaneously bias a respective NMOS transistor of each of the rectifier stages; and
the other bias current path is configured to direct a second bias current to simultaneously bias a respective PMOS transistor of each of the rectifier stages.

17. The rectifier of claim 15, wherein:
a biasing transistor is configured to current-bias the first rectifying element; and
a gate of the second rectifying element is voltage-biased.

18. The rectifier of claim 15, wherein:
the bias current path includes a ladder of resistive elements arranged sequentially, and
a voltage between two adjacent resistive elements of the ladder track a corresponding voltage on the main current path.

19. The rectifier of claim 18, wherein the resistive elements include source-follower-configured transistors.

20. The rectifier of claim 15, wherein the single bias current is generated by:
at least one current mirror,
the rectifier, or
another rectifier.

* * * * *

UNITED STATES PATENT AND TRADEMARK OFFICE
CERTIFICATE OF CORRECTION

| | |
|---|---|
| PATENT NO. | : 12,204,970 B1 |
| APPLICATION NO. | : 17/970794 |
| DATED | : January 21, 2025 |
| INVENTOR(S) | : Charles J. T. Peach et al. |

It is certified that error appears in the above-identified patent and that said Letters Patent is hereby corrected as shown below:

On the Title Page

In Column 2 item (57) (Abstract), Line 5, Delete "Thee" and insert -- The --, therefor.

In the Drawings

Sheet 5 of 8 (FIG. 7), Line 1 (Approx.), Above "702 CURRENT MIRRORS" insert -- 700 --, therefor.

Sheet 6 of 8 (FIG. 8), and on the Title Page, the illustrative print figure, Line 1 (Approx.), Above "802 CURRENT MIRRORS" insert -- 800 --, therefor.

Sheet 7 of 8 (FIG. 9), Line 1 (Approx.), Above "902 CURRENT MIRRORS AND SUPPLIES" insert -- 900 --, therefor.

Sheet 8 of 8 (FIG. 10), Line 1 (Approx.), Above "1002 CURRENT MIRRORS" insert -- 1000 --, therefor.

In the Specification

In Column 1, Line 45, Delete "May" and insert -- may --, therefor.

In Column 2, Line 16, Delete "Thee" and insert -- The --, therefor.

In Column 2, Line 61, Delete "May" and insert -- may --, therefor.

In Column 3, Line 18, Delete "GSI" and insert -- GS1 --, therefor.

Signed and Sealed this
Twenty-second Day of April, 2025

Coke Morgan Stewart
*Acting Director of the United States Patent and Trademark Office*

In Column 3, Line 34, Delete "MHZ," and insert -- MHz, --, therefor.

In Column 14, Line 11, Delete "more"):" and insert -- more"); --, therefor.